United States Patent
Maxwell et al.

(10) Patent No.: US 10,457,222 B2
(45) Date of Patent: Oct. 29, 2019

(54) ELECTRONICS SYSTEMS CLUSTER WITH INTERLOCKING BRACKETS

(71) Applicant: FORD GLOBAL TECHNOLOGIES, LLC, Dearborn, MI (US)

(72) Inventors: Kurt Hugh Maxwell, Canton, MI (US); Scott Holmes Dunham, Redford, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 0 days.

(21) Appl. No.: 15/804,616

(22) Filed: Nov. 6, 2017

(65) Prior Publication Data

US 2019/0135190 A1 May 9, 2019

(51) Int. Cl.
| | |
|---|---|
| *H05K 5/02* | (2006.01) |
| *B60R 11/00* | (2006.01) |
| *B60R 16/02* | (2006.01) |
| *B60S 1/02* | (2006.01) |
| *H05K 5/03* | (2006.01) |
| *H05K 7/12* | (2006.01) |
| *B60K 35/00* | (2006.01) |
| *H05K 7/14* | (2006.01) |

(52) U.S. Cl.
CPC ............. *B60R 11/00* (2013.01); *B60K 35/00* (2013.01); *B60R 16/02* (2013.01); *B60S 1/026* (2013.01); *H05K 5/0208* (2013.01); *H05K 5/03* (2013.01); *H05K 7/12* (2013.01); *H05K 7/14* (2013.01); *B60R 2011/0026* (2013.01); *B60R 2011/0063* (2013.01); *B60R 2011/0064* (2013.01)

(58) Field of Classification Search
CPC ....... B60R 11/00; B60R 16/02; H05K 5/0208; H05K 5/03; H05K 7/12
See application file for complete search history.

(56) References Cited

U.S. PATENT DOCUMENTS

| | | | |
|---|---|---|---|
| 9,434,314 B2 * | 9/2016 | DeLine | B60R 1/12 |
| 9,487,159 B2 * | 11/2016 | Achenbach | B60R 11/04 |
| 9,604,576 B2 | 3/2017 | Uken et al. | |
| 2008/0212215 A1 * | 9/2008 | Schofield | B60C 23/00 |
| | | | 359/844 |
| 2009/0295181 A1 | 12/2009 | Lawlor et al. | |
| 2010/0090086 A1 | 4/2010 | Zinser et al. | |
| 2010/0110641 A1 | 5/2010 | Okahashi | |

(Continued)

FOREIGN PATENT DOCUMENTS

| | | |
|---|---|---|
| EP | 3103684 A1 | 12/2016 |
| WO | 2016076589 A1 | 5/2016 |

OTHER PUBLICATIONS

Office Action dated May 2, 2019 for U.S. Appl. No. 16/288,443, filed Feb. 28, 2019.

*Primary Examiner* — Hoa C Nguyen
*Assistant Examiner* — Christopher L Augustin
(74) *Attorney, Agent, or Firm* — Vichit Chea; King & Schickli, PLLC

(57) ABSTRACT

An electronics systems cluster includes a plurality of brackets, a plurality of electronic devices held in the plurality of brackets and an interlocking feature securing the plurality of brackets directly together into a small footprint configuration less likely to interfere with driver sight lines. A related method of reducing a footprint of an electronics systems cluster is also disclosed.

14 Claims, 4 Drawing Sheets

(56) References Cited

U.S. PATENT DOCUMENTS

| | | |
|---|---|---|
| 2011/0233248 A1* | 9/2011 | Flemming ............... B60R 11/00 |
| | | 224/482 |
| 2012/0105990 A1 | 5/2012 | Quinn et al. |
| 2013/0214548 A1* | 8/2013 | Harders ............. B60R 13/0206 |
| | | 296/24.34 |
| 2014/0226012 A1 | 8/2014 | Achenbach |
| 2014/0226329 A1 | 8/2014 | Oraw et al. |
| 2015/0015713 A1 | 1/2015 | Wang et al. |
| 2015/0097013 A1 | 4/2015 | Rawlings et al. |
| 2015/0251605 A1* | 9/2015 | Uken .................. H04N 5/2257 |
| | | 248/467 |
| 2015/0314735 A1* | 11/2015 | Krug .................... B60S 1/0881 |
| | | 248/205.3 |
| 2016/0069557 A1 | 3/2016 | Ruckgauer |
| 2016/0096489 A1* | 4/2016 | DeLine .................... B60R 1/12 |
| | | 348/148 |

* cited by examiner

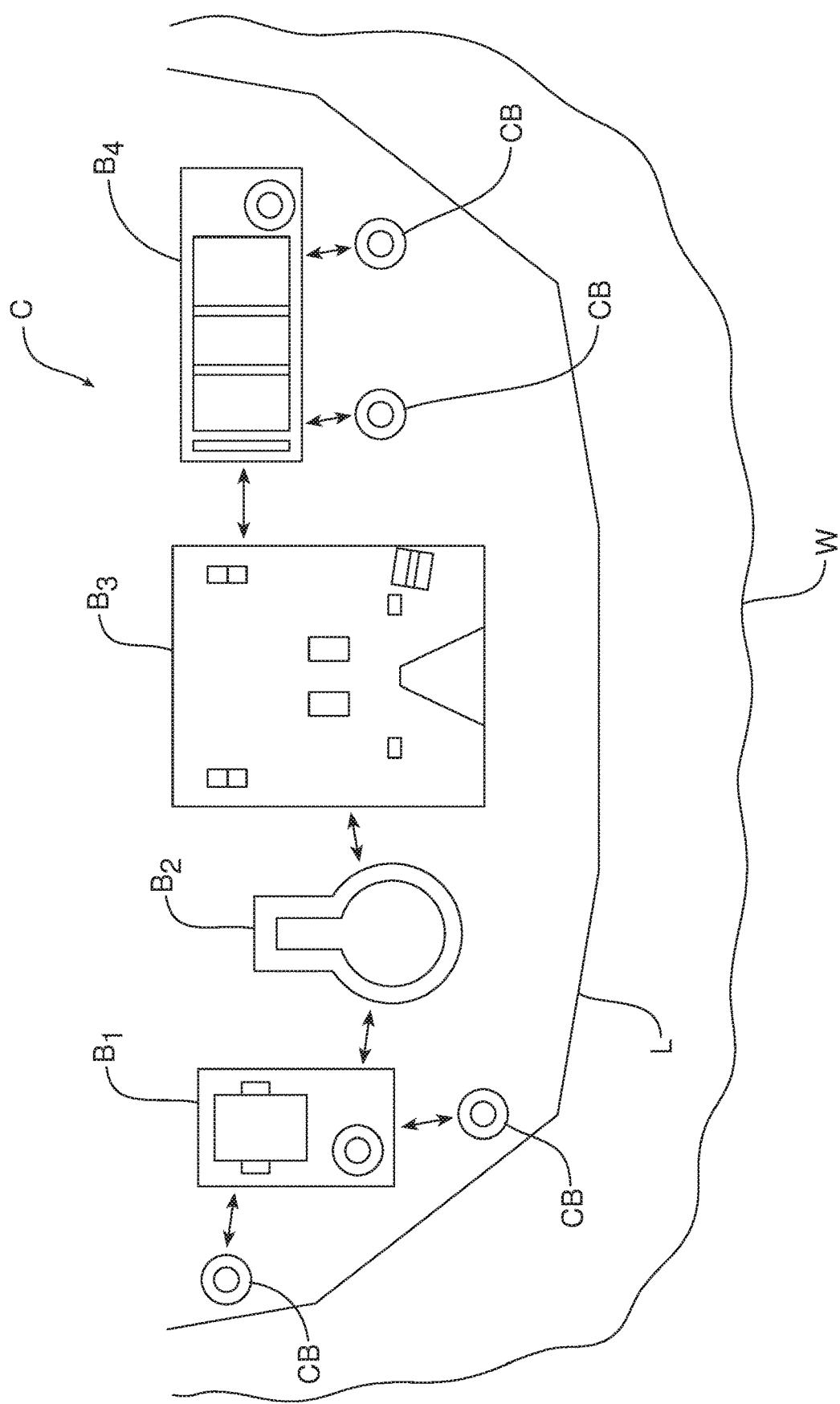

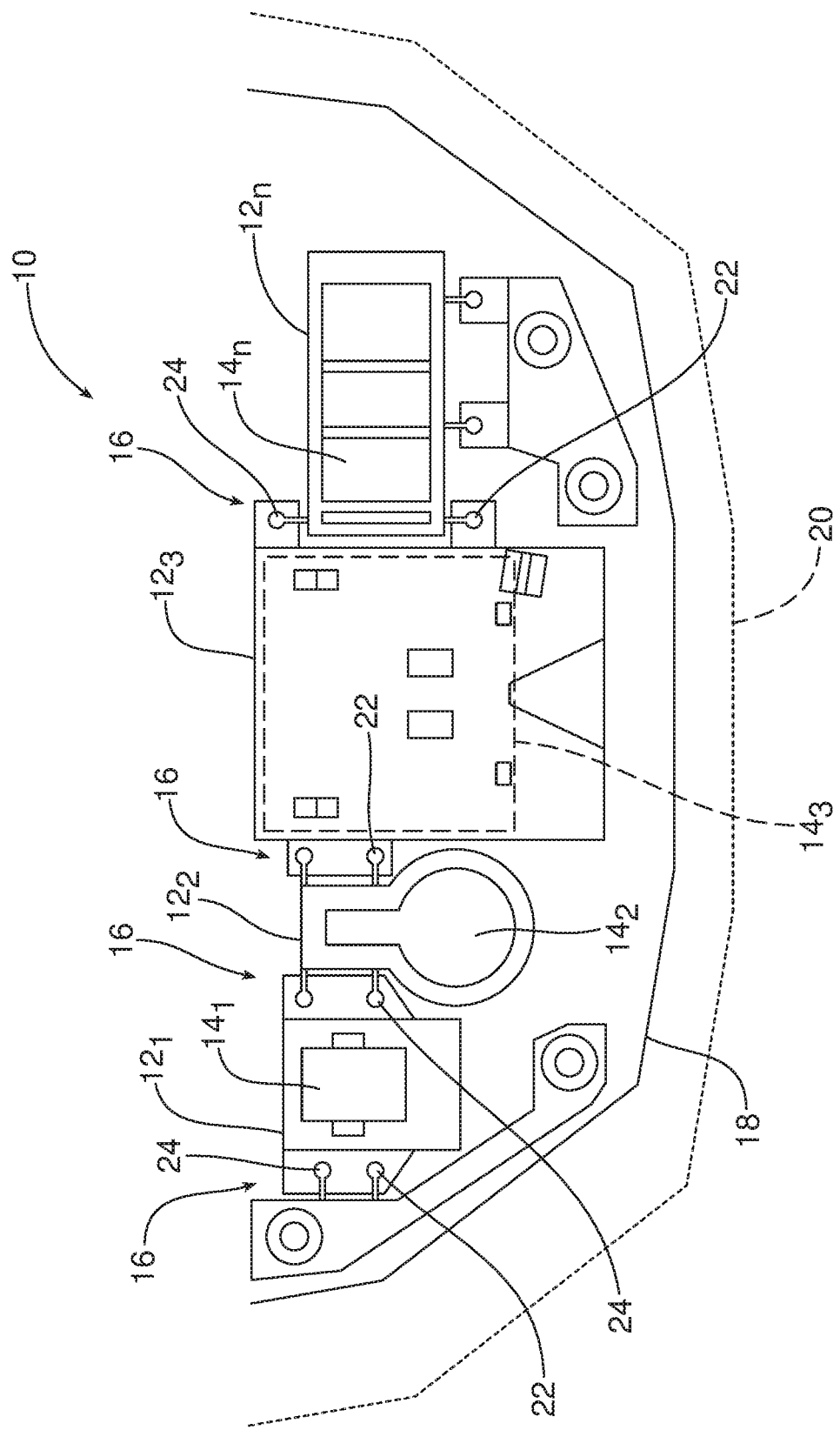

ELECTRONICS SYSTEMS CLUSTER WITH INTERLOCKING BRACKETS

TECHNICAL FIELD

This document relates generally to the motor vehicle equipment field and, more particularly, to an electronics systems cluster incorporating a plurality of electronic devices held in a plurality of interlocking brackets.

BACKGROUND

This document relates to a new and improved electronics systems cluster that holds a number of different electronic components and safety features along the upper center portion of the windshield of a motor vehicle. Advantageously, the electronics systems cluster has a small footprint and a low profile housing of compact design that minimizes forward vision obstruction. The electronics systems cluster may include or hold some or all of the following: (1) an image processing module, also known as image processing module A (IPMA), comprising a camera that provides autonomous emergency braking, lane keep assistance and auto high beam control, (2) a rain light sensor (RLS) which functions as a rain sensor for automatic wiping and as an outdoor light sensor, (3) a USB charger such as a smart charger made for connection to dashboard cameras and other dashboard mounted electronic equipment, (4) an electronic windshield anti-fogging system (EWAFS) comprising a temperature and humidity sensor that provides automatic operation of the defroster when conditions cause fogging of the interior windshield, (5) wire routing features that serve to eliminate rattling of wires within the housing, (6) a tethering hook to ensure safety in the event of interior rearview mirror detachment during a dynamic event, (7) clearances for heater terminals that attach wiring to a local heating grid adapted to maintain the windshield clear for proper operation of the IPMA and (8) cover mounting features that positively retain the housing cover while still providing ready access for service.

SUMMARY

In accordance with the purposes and benefits described herein, an electronics systems cluster is provided. That electronics systems cluster comprises a plurality of brackets, a plurality of electronic devices held in the plurality of brackets and an interlocking feature securing the plurality of brackets directly together. In one possible embodiment, each electronic device is held in its own bracket.

The interlocking feature may include cooperating male and female connectors. In some of the many possible embodiments, the interlocking feature may include a plurality of cooperative dovetail connectors. The plurality of cooperating dovetail connectors may be provided along edges of the plurality of brackets.

The electronic devices may be selected from a group of electronic devices consisting of an image processing module A, a rain light sensor, an electronic windshield anti fogging system, a USB port and combinations thereof.

The electronics systems cluster may further include wire routing features on the plurality of brackets. The electronics systems cluster may further include a tethering hook on at least one bracket of the plurality of brackets. The electronics systems cluster may further include heater terminals for a local windshield heating grid on at least one bracket of the plurality of brackets.

The electronics systems cluster may further include an adhesive securing the plurality of brackets to a windshield of a motor vehicle. Still further, the electronics systems cluster may further include a cover concealing the plurality of brackets on the windshield.

In accordance with an additional aspect, an electronics systems cluster may comprise a first bracket, an image processing module A carried on the first bracket, a second bracket, a rain light sensor carried on the second bracket, a third bracket, an electronic windshield anti-fogging system carried on the third bracket and an interlocking feature. The interlocking feature secures the second bracket to the first bracket and the third bracket to the second bracket.

The electronics systems cluster may further include a fourth bracket and a USB port carried on the fourth bracket. In such an embodiment, the interlocking feature secures the fourth bracket to the first bracket.

The electronics systems cluster may further include an adhesive securing the first bracket, the second bracket, the third bracket and the fourth bracket to a windshield of a motor vehicle. The electronics systems cluster may also further include a cover concealing the first bracket, the second bracket, the third bracket and the fourth bracket.

In accordance with yet another aspect, a method is provided for reducing a footprint of an electronics systems cluster at a top of a windshield of a motor vehicle. That method comprises the steps of (a) locating a plurality of electronic devices in a plurality of brackets, (b) interlocking, by interlocking feature, the plurality of brackets together and (c) adhering, by adhesive, the plurality of brackets to the windshield.

The method may further include the step of interlocking, by the interlocking feature, a first bracket carrying an image processing module A with a second bracket carrying a rain light sensor. Further, the method may include the step of interlocking, by the interlocking feature, a third bracket carrying an electronic windshield anti-fogging system to the second bracket.

The method may also include the step of interlocking, by the interlocking feature a fourth bracket carrying a USB port to the first bracket. The method may also include the step of providing a wire routing feature on at least one bracket of the plurality of brackets. In addition, the method may include the step of allowing, by the interlocking feature, freedom of movement perpendicular to a tangent plane of the windshield.

In the following description, there are shown and described several preferred embodiments of the electronics systems cluster and the related method of reducing a footprint of an electronics systems cluster at a top of a windshield of a motor vehicle. As is should be realized, the electronics systems cluster and related method are capable of other, different embodiments and their several details are capable of modification in various, obvious aspects all without departing from the electronics systems cluster and method as set forth and described in the following claims. Accordingly, the drawings and descriptions should be regarded as illustrative in nature and not as restrictive.

BRIEF DESCRIPTION OF THE DRAWING FIGURES

The accompanying drawing figures incorporated herein and forming a part of the specification, illustrate several aspects of the electronics systems cluster and related method together with the description serve to explain certain principles thereof.

FIG. 1a illustrates an electronics systems cluster incorporating a plurality of electronic devices held in individual or separate brackets wherein those brackets do not include any interlocking feature.

FIG. 1b is a schematic illustration of the electronics system cluster incorporating an interlocking feature for securing the plurality of brackets directly together and reducing the overall footprint of the electronics systems cluster at the top of a windshield of a motor vehicle.

Figure 2A:
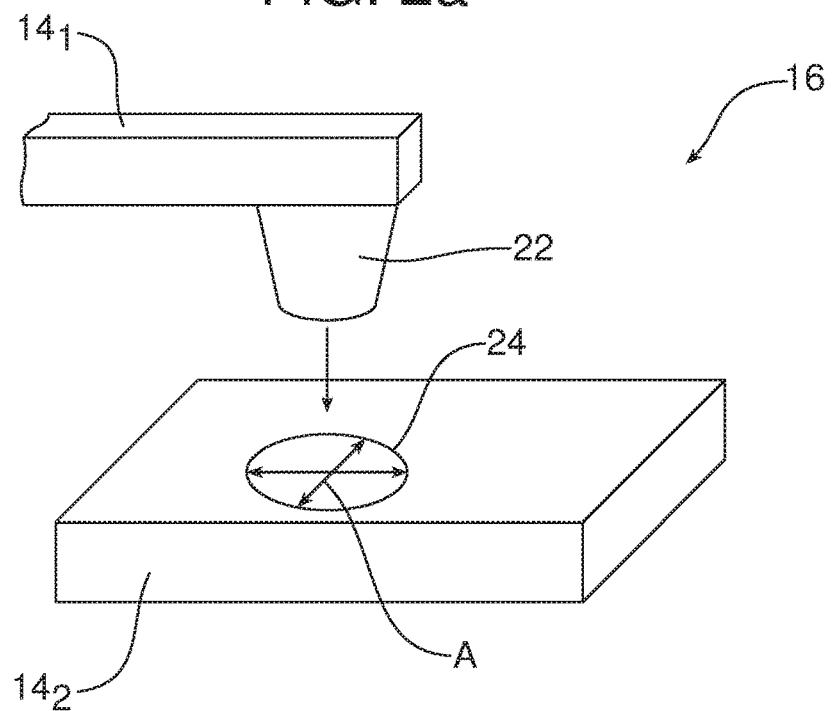
FIG. 2a is a schematic illustration of an interlocking feature incorporating a four-way locator.

Reference will now be made in detail to the present preferred embodiments of the electronics systems cluster, examples of which are illustrated in the accompanying drawing figures.

DETAILED DESCRIPTION

Reference is now made to FIG. 1a illustrating an electronics systems cluster C including a plurality of brackets $B_1$-$B_4$ for holding separate electronic devices. The double-ended action arrows indicate clearance required between the brackets $B_1$-$B_4$ and the cover buttons CB to robotically place individual brackets on the windshield W. The line L indicates the outline of the cover for the electronics systems cluster C which is the effective footprint of such an electronics systems cluster with separate brackets in the absence of any interlocking features to secure those brackets directly together.

FIG. 1b is a schematic illustration of the new and improved electronics systems cluster 10 that is the subject matter of this document. That electronics systems cluster 10 includes a plurality of brackets $12_1$-$12_n$. A plurality of electronic devices $14_1$-$14_n$ are received and held in the plurality of brackets $12_1$-$12_n$. In the illustrated embodiment, one electronic device $14_1$-$14_n$ is held in each of the brackets $12_1$-$12_n$.

As illustrated in FIG. 1b, the electronics systems cluster 10 also includes an interlocking feature, generally designated by reference numeral 16, for securing the plurality of brackets $12_1$-$12_n$ directly together. By securing the separate or independent brackets $12_1$-$12_n$ together, it is no longer necessary to provide space between the brackets for robotic placement as illustrated in FIG. 1a. Accordingly, the plurality of brackets $12_1$-$12_n$ holding the plurality of electronic devices $14_1$-$14_n$ consume a smaller space and have a smaller footprint. This is visually indicated by comparing the outline of the cover 18 for the electronics systems cluster 10 to the phantom line 20 which represents the expanse of the cover of the electronics systems cluster C illustrated in FIG. 1a wherein the plurality of brackets $B_1$-$B_4$ do not include any interlocking feature.

Advantageously, by reducing the footprint of the electronics system cluster 10 and providing a more compact design, forward vision obstruction by the electronics systems cluster is minimized and the sightlines of the driver are enhanced for easier operation of the motor vehicle.

As illustrated in FIG. 1b, the interlocking feature 16 may include cooperating male connectors 22 and female connectors 24. The male connectors 22 and female connectors 24 may be molded with and formed as an integral part of the brackets $12_1$-$12_n$.

Figure 2B:
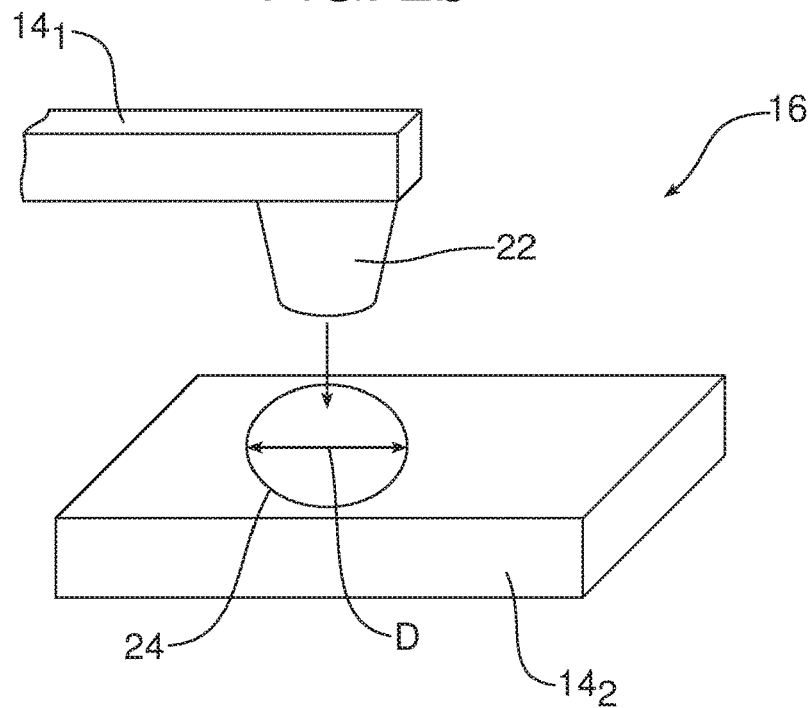
FIG. 2b is a detailed schematic illustration of an interlocking feature incorporating a two-way locator.

As illustrated in FIG. 2a, the cooperating male connector 22 received in the female connector 24 may function as a four-way locator (note action arrows A). In contrast, as illustrated in FIG. 2b, the cooperating male connector 22 received in the female connector 24 may comprise a two-way locator (note action arrow D).

Figure 3:
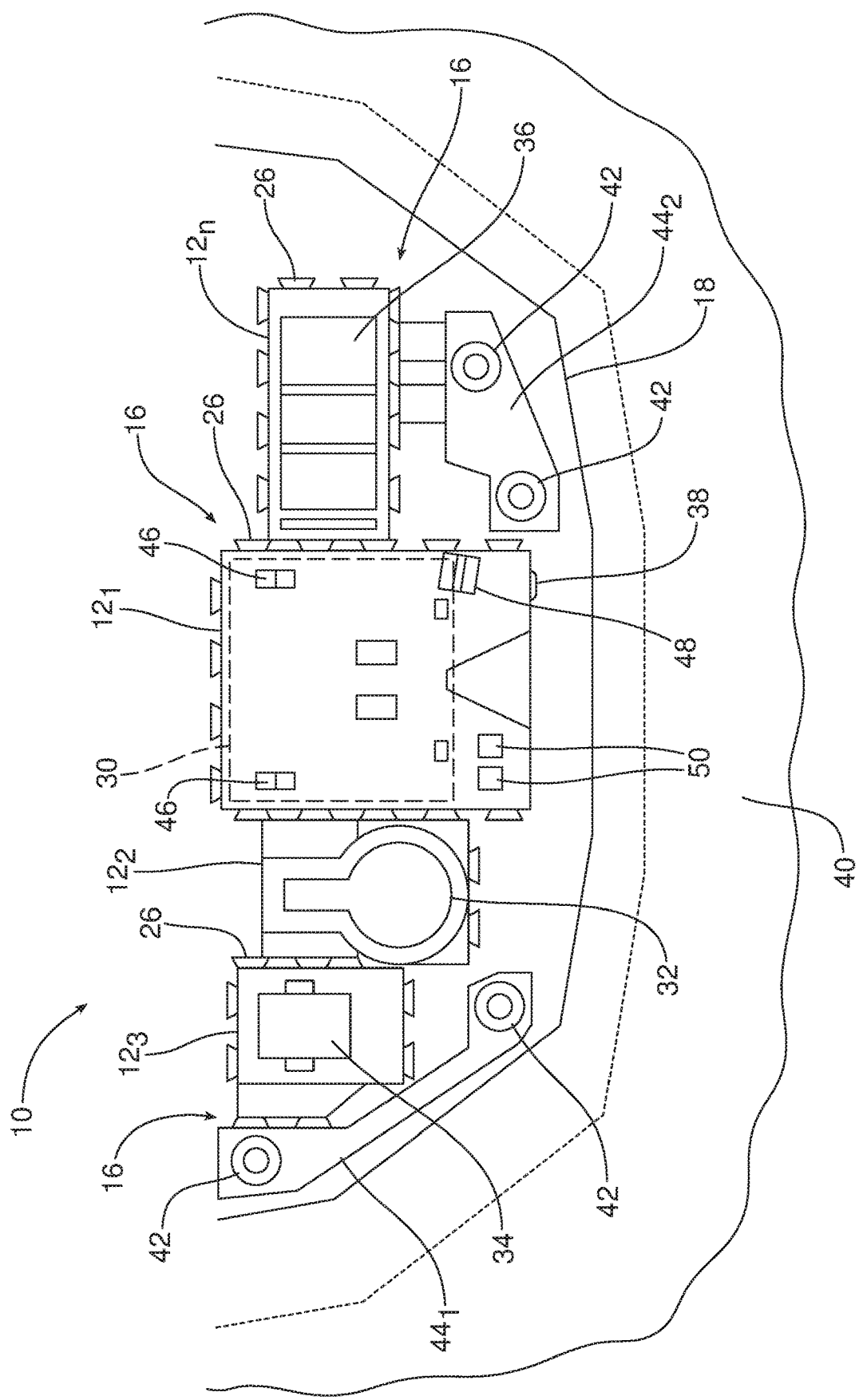
FIG. 3 is a schematic illustration of an electronics systems cluster incorporating an interlocking feature in the form of a plurality of cooperating dovetail connectors provided along edges of the plurality of brackets and utilized to secure those brackets directly together in a relatively small footprint configuration that minimizes forward vision obstruction.

As illustrated in FIG. 3, the interlocking feature 16 may comprise a plurality of cooperating dovetail connectors 26. Those cooperating plurality of dovetail connectors 26 may be provided along edges of the brackets $12_1$-$12_n$ as shown.

As illustrated in FIG. 3, the first bracket $12_1$ receives and holds an image processing module A 30, the second bracket $12_2$ receives and holds a rain light sensor 32, the third bracket $12_3$ receives and holds an electronic windshield anti-fogging system 34 and the fourth bracket $12_n$ receives and holds a USB port 36 for charging an electronic device or providing a data pathway between an electronic device and an onboard motor vehicle system through the controller area network (CAN) of the motor vehicle. In the illustrated embodiment, the interlocking feature 16 or, more specifically, dovetail connectors 26, secure the second bracket $12_2$ to the first bracket $12_1$, the third bracket $12_3$ to the second bracket and the fourth bracket $12_n$ to the first bracket. An adhesive 38 (on the side hidden from view) secures the first bracket $12_1$, the second bracket $12_2$, the third bracket $12_3$ and the fourth bracket $12_n$ to the windshield 40 of the motor vehicle. The cover 18 conceals the brackets $12_1$-$12_n$ and the electronic devices $14_1$-$14_n$ held therein from view so as to provide an aesthetically pleasing package.

The cover 18 is secured in place on the cover buttons or clip points 42. In the embodiment illustrated in FIG. 3, the cover buttons or clip points 42 are provided on separate cover brackets $44_1$, $44_2$. In the illustrated embodiment, the cover bracket $44_1$ is connected by interlocking features 16 to the third bracket $12_3$ while cover bracket $44_2$ is connected by the interlocking feature 16 to the fourth bracket $12_n$. Here it should be appreciated that in other embodiments, the cover buttons or clip points 42 may be provided on one or more of the brackets $12_1$-$12_n$.

In addition to the features described above, the brackets $12_1$-$12_n$ may include wire routing features 46, such as posts, clips or the like, and a tethering hook 48. The wire routing features 46 receive and hold wiring to prevent rattling while the tethering hook 48 functions as an anchor point for a tether connected to a rearview mirror. That tether (not shown) will prevent a rearview mirror from flying freely across the passenger compartment of the motor vehicle in the event of an accident of sufficient force to dislodge the rearview mirror from the windshield.

Heater terminals 50 may also be carried on one or more of the brackets $12_1$-$12_n$ or cover brackets $44_1$-$44_2$. Such heater terminals 50 are provided for a local windshield heating grid used to maintain a clear windshield in front of the image processing module A 30.

Consistent with the above description, a method is provided for reducing a footprint of an electronics system cluster 10 on top of a windshield 40 of a motor vehicle. That method comprises the steps of: (a) locating a plurality of electronic devices $14_1$-$14_n$ in a plurality of brackets $12_1$-$12_n$, (b) interlocking, by interlocking feature 16, the plurality of brackets together and (c) adhering, by adhesive 38 the plurality of brackets to the windshield 40.

In one or more of the many possible embodiments, the method includes the step of interlocking, by the interlocking feature 16, the first bracket 121, carrying an image processing module A 30 with a second bracket $12_2$ carrying a rain light sensor 32. Further, the method may include the step of interlocking, by the interlocking feature 16, the third bracket $12_3$, carrying an electronic windshield anti-fogging system 34, to the second bracket $12_2$. Further, the method may include the step of interlocking, by the interlocking feature 16, the fourth bracket $12_n$, carrying a USB port 36, to the first bracket $12_1$.

In addition, the method may include providing at least one wire routing feature 46 on at least one of the brackets $12_1$-$12_n$. Further, the method may include allowing, by the interlocking feature 16, freedom of movement perpendicular to a tangent plane of the windshield 40. In other words, the interlocking feature 16 allows for one bracket to be staggered in position with respect to an adjacent bracket in order to accommodate windshield curvature and allow for proper windshield mounting using a simple and inexpensive adhesive. This also allows for windshield variability so that the quick curing adhesive may be used to fix the individual brackets $12_1$-$12_n$ to a number of different windshields of different shape across a wide model range. This reduces the number of parts required by the motor vehicle manufacturer and provides substantial savings in production costs.

The foregoing has been presented for purposes of illustration and description. It is not intended to be exhaustive or to limit the embodiments to the precise form disclosed. Obvious modifications and variations are possible in light of the above teachings. For example, as illustrated above, the interlocking feature 16 comprises cooperating male 22 and female 24 connectors such as the four-way locator schematically illustrated in FIG. 2a, the two-way locator schematically illustrated in FIG. 2b, and the cooperating dovetail connectors 26 schematically illustrated in FIG. 3. It should be appreciated that the interlocking feature 16 may comprise a variety of different shapes and sizes even in the same electronics systems cluster 10. This would allow the plurality of brackets $12_1$-$12_n$ to be pieced together in the manner of a puzzle thereby ensuring that the brackets are all interconnected in the proper configuration. All such modifications and variations are within the scope of the appended claims when interpreted in accordance with the breadth to which they are fairly, legally and equitably entitled.

What is claimed:

1. An electronics systems cluster, comprising:
   a plurality of brackets;
   a plurality of electronic devices held in said plurality of brackets; and
   an interlocking feature securing said plurality of brackets directly together wherein said interlocking feature includes a plurality of cooperating dovetail connectors.

2. The electronics systems cluster of claim 1, wherein said plurality of cooperating dovetail connectors are provided along edges of said plurality of brackets.

3. The electronics systems cluster of claim 2, wherein said electronic devices are selected from a group of electronic devices consisting of an image processing module A, a rain light sensor, an electronic windshield antifogging system, a USB port and combinations thereof.

4. The electronics systems cluster of claim 3, further including wire routing features on said plurality of brackets.

5. The electronics systems cluster of claim 4, further including a tethering hook on at least one bracket of said plurality of brackets.

6. The electronics systems cluster of claim 4, further including heater terminals for a local windshield heating grid on at least one bracket of said plurality of brackets.

7. The electronics systems cluster of claim 4 further including an adhesive securing said plurality of brackets to a windshield of a motor vehicle.

8. The electronics systems cluster of claim 7, further including a cover concealing said plurality of brackets on said windshield.

9. An electronics systems cluster, comprising:
   a first bracket;
   an image processing module A carried on said first bracket;
   a second bracket;
   a rain light sensor carried on said second bracket;
   a third bracket;
   an electronic windshield antifogging system carried on said third bracket;
   a fourth bracket; and
   a USB port carried on said fourth bracket;
   an interlocking feature securing said second bracket to said first bracket, said third bracket to said second bracket and said fourth bracket to said first bracket.

10. The electronics systems cluster of claim 9, further including an adhesive securing said first bracket, said second bracket, said third bracket and said fourth bracket to a windshield of a motor vehicle.

11. The electronics systems cluster of claim 10, further including a cover concealing said first bracket, said second bracket, said third bracket and said fourth bracket.

12. A method of reducing a footprint of an electronics systems cluster at a top of a windshield of a motor vehicle, comprising:
   locating a plurality of electronic devices in a plurality of brackets;
   interlocking, by interlocking feature, a first bracket carrying an image processing module A with a second bracket carrying a rain light sensor, a third bracket carrying an electronic windshield antifogging system to said second bracket and a fourth bracket carrying a USB port to said first bracket; and
   adhering, by adhesive, said plurality of brackets to said windshield.

13. The method of claim 12, including providing a wire routing feature on at least one bracket of said plurality of brackets.

14. The method of claim 12, including allowing, by said interlocking feature, freedom of movement perpendicular to a tangent plane of said windshield.

* * * * *